US011830659B2

(12) United States Patent
Yen et al.

(10) Patent No.: US 11,830,659 B2
(45) Date of Patent: Nov. 28, 2023

(54) SHIELDING STRUCTURE AND INDUCTOR DEVICE

(71) Applicant: Realtek Semiconductor Corporation, Hsinchu (TW)

(72) Inventors: Hsiao-Tsung Yen, Hsinchu (TW); Yi-Syue Han, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 151 days.

(21) Appl. No.: 17/402,714

(22) Filed: Aug. 16, 2021

(65) Prior Publication Data
US 2022/0270811 A1    Aug. 25, 2022

(30) Foreign Application Priority Data

Feb. 20, 2021   (TW) .................................. 110106004

(51) Int. Cl.
H01F 27/28    (2006.01)
H05K 9/00    (2006.01)
(52) U.S. Cl.
CPC ....... H01F 27/2885 (2013.01); H05K 9/0073 (2013.01)

(58) Field of Classification Search
CPC .... H01F 27/2885; H01F 27/363; H01F 27/36; H01F 27/361; H01F 27/366; H05K 9/0073; H05K 9/0064
See application file for complete search history.

(56) References Cited

U.S. PATENT DOCUMENTS 9,780,162 B2    10/2017    Yen et al.
9,883,590 B2    1/2018    Huang et al.
10,134,684 B2    11/2018    Yen et al.
2017/0223877 A1*   8/2017    Yen .................... H01L 23/552
2021/0090988 A1    3/2021    Yen et al.

FOREIGN PATENT DOCUMENTS

CN    105990311 A  * 10/2016
KR    100834744 B1 *  6/2008

* cited by examiner

Primary Examiner — Tuyen T Nguyen
(74) Attorney, Agent, or Firm — Locke Lord LLP; Tim Tingkang Xia, Esq.

(57) ABSTRACT

A shielding structure is disclosed. The shielding structure includes a patterned shielding layer and a ring structure. The patterned shielding layer is extended along a plane and located between an inductor structure and a substrate. The ring structure is coupled to and stacked on the patterned shielding layer along a first direction. The first direction is perpendicular to the plane. The ring structure surrounds the patterned shielding layer. The ring structure includes at least one opening and a ground terminal.

20 Claims, 8 Drawing Sheets

SHIELDING STRUCTURE AND INDUCTOR DEVICE

CROSS-REFERENCE TO RELATED APPLICATION

This application claims the priority benefit of TAIWAN Application serial no. 110106004, filed Feb. 20, 2021, the full disclosure of which is incorporated herein by reference.

BACKGROUND

Field of Invention

The invention relates to a shielding structure and an inductor device. More particularly, the invention relates to a shielding structure and an inductor device applied to integrated inductors.

Description of Related Art

With the development of integrated circuit technology, the size of the sub components in the integrated circuit is getting smaller and smaller. However, when the size of the sub components becomes smaller and smaller, there may be many negative effects. For example, when the inductor is operating, the eddy current generated by the substrate will affect the quality factor value (Q value) of the inductor. In order to solve the above problems, an appropriate solution is needed.

SUMMARY

An aspect of this disclosure is to provide a shielding structure. The shielding structure includes a patterned shielding layer and a ring structure. The patterned shielding layer is extended along a plane and located between an inductor structure and a substrate. The ring structure is coupled to and stacked on the patterned shielding layer along a first direction. The first direction is perpendicular to the plane. The ring structure surrounds the patterned shielding layer. The ring structure includes at least one opening and a ground terminal.

Another aspect of this disclosure is to provide an inductor device. The inductor device includes an inductor structure, a patterned shielding layer and a ring structure. The patterned shielding layer is extended along a plane and located between the inductor structure and a substrate. The ring structure is coupled to and stacked on the patterned shielding layer along a first direction. The first direction is perpendicular to the plane. The ring structure surrounds the patterned shielding layer. The ring structure includes a first opening and a ground terminal.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

Figure 1:
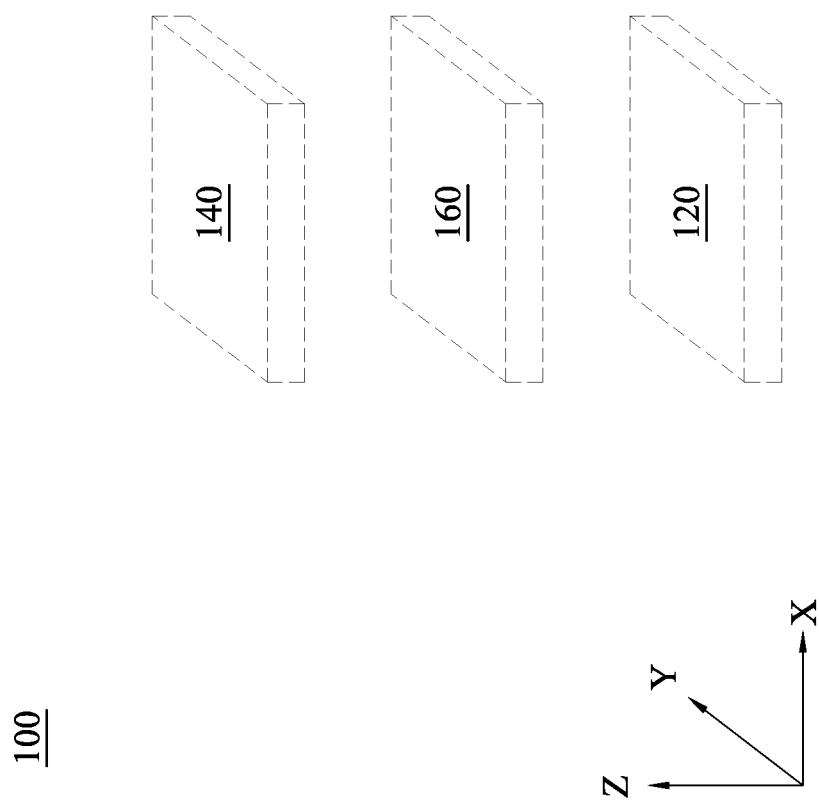
FIG. 1 is a schematic diagram of an inductor device according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention.

Reference is made to FIG. 1. FIG. 1 is a schematic diagram of an inductor device 100 according to some embodiments of the present disclosure. The inductor device 100 includes a substrate 120, an inductor structure 140 and a patterned shielding layer 160. As illustrated in FIG. 1, the substrate 120, the inductor structure 140 and the patterned shielding layer 160 are disposed on the plane formed by the X direction and the Y direction. The X direction is perpendicular to the Y direction, and the patterned shielding layer 160 is located between the substrate 120 and the inductor structure 140.

In related technologies, if there is no patterned shielding layer 160 disposed between the substrate 120 and the inductor structure 140, the magnetic field generated during the operation of the inductor structure 140 will cause eddy currents on the substrate 120. The eddy current will affect the quality factor value (Q value) of the inductor structure 140.

By disposing the patterned shielding layer 160 between the substrate 120 and the inductor structure 140, the patterned shielding layer 160 can reduce the mutual inductance of the inductor structure 140, so as to prevent the substrate 120 from generating the aforementioned eddy current, thereby effectively maintaining the quality factor value (Q value) of the inductor structure 140.

However, even though the patterned shielding layer 160 can reduce the mutual inductance of the inductor structure 140, in some embodiments, the quality factor value of the inductor structure 140 is still expected to be better. In the embodiments of the present disclosure, the following shielding structures as shown in FIG. 2 to FIG. 6 are proposed.

Figure 2:
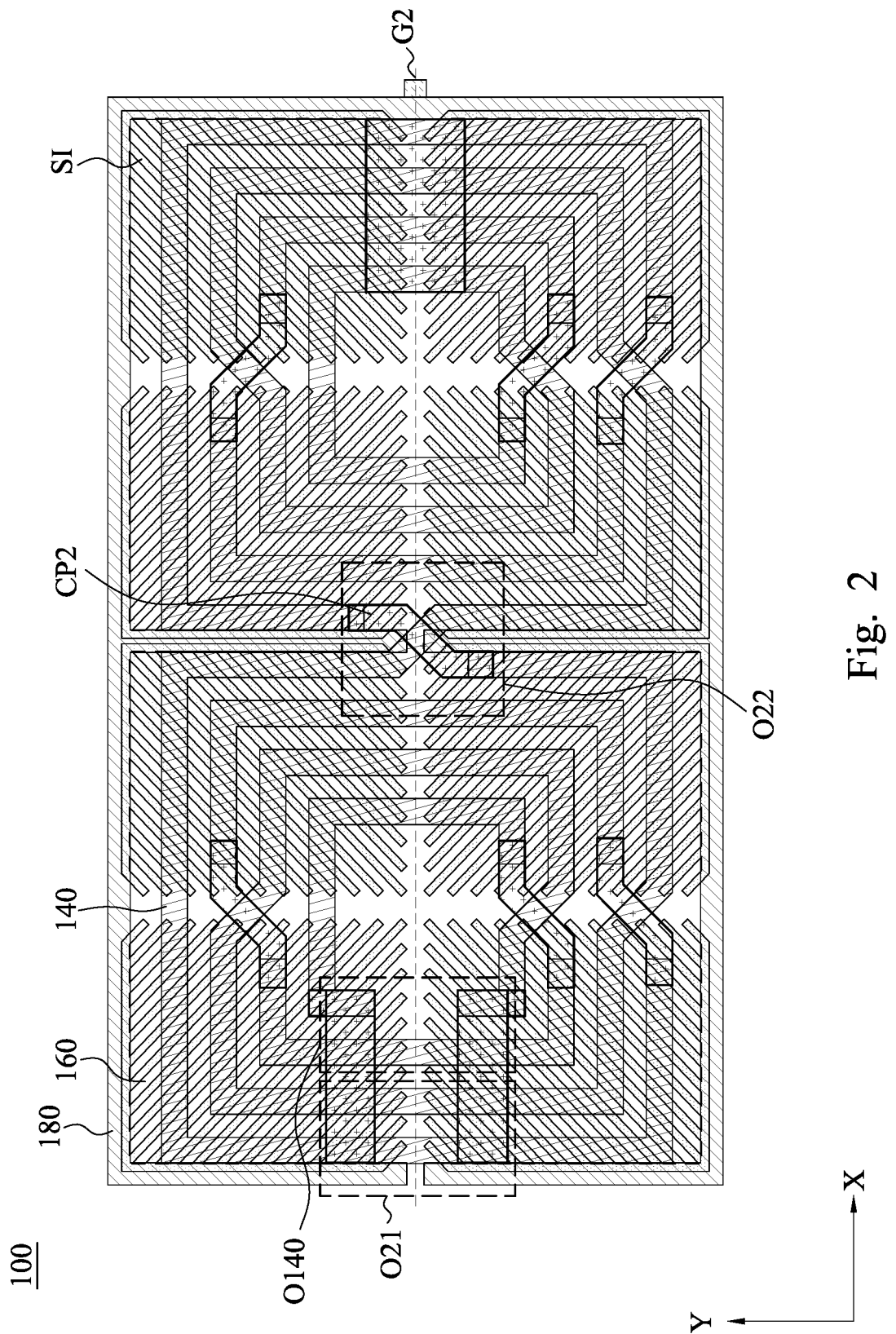
FIG. 2 is a top view diagram of an inductor device according to some embodiments of the present disclosure.

Reference is made to FIG. 2. FIG. 2 is a top view diagram of an inductor device 100 according to some embodiments of the present disclosure. As illustrated in FIG. 2, the inductor structure 140 is located on the patterned shielding layer 160, and is surrounded by the ring structure 180. The patterned shielding layer 160 and the ring structure 180 form a shielding structure.

The shape or configuration of the inductor structure 140 as shown in FIG. 2 is only for illustrative purposes only. The various shapes or configurations of the inductor structure 140 are within the scope of this disclosure.

The shielding structure formed by the shielding layer 160 and the ring structure 180 in FIG. 2 can be implemented in different ways, which will be described in FIG. 3 to FIG. 7 below.

Figure 3:
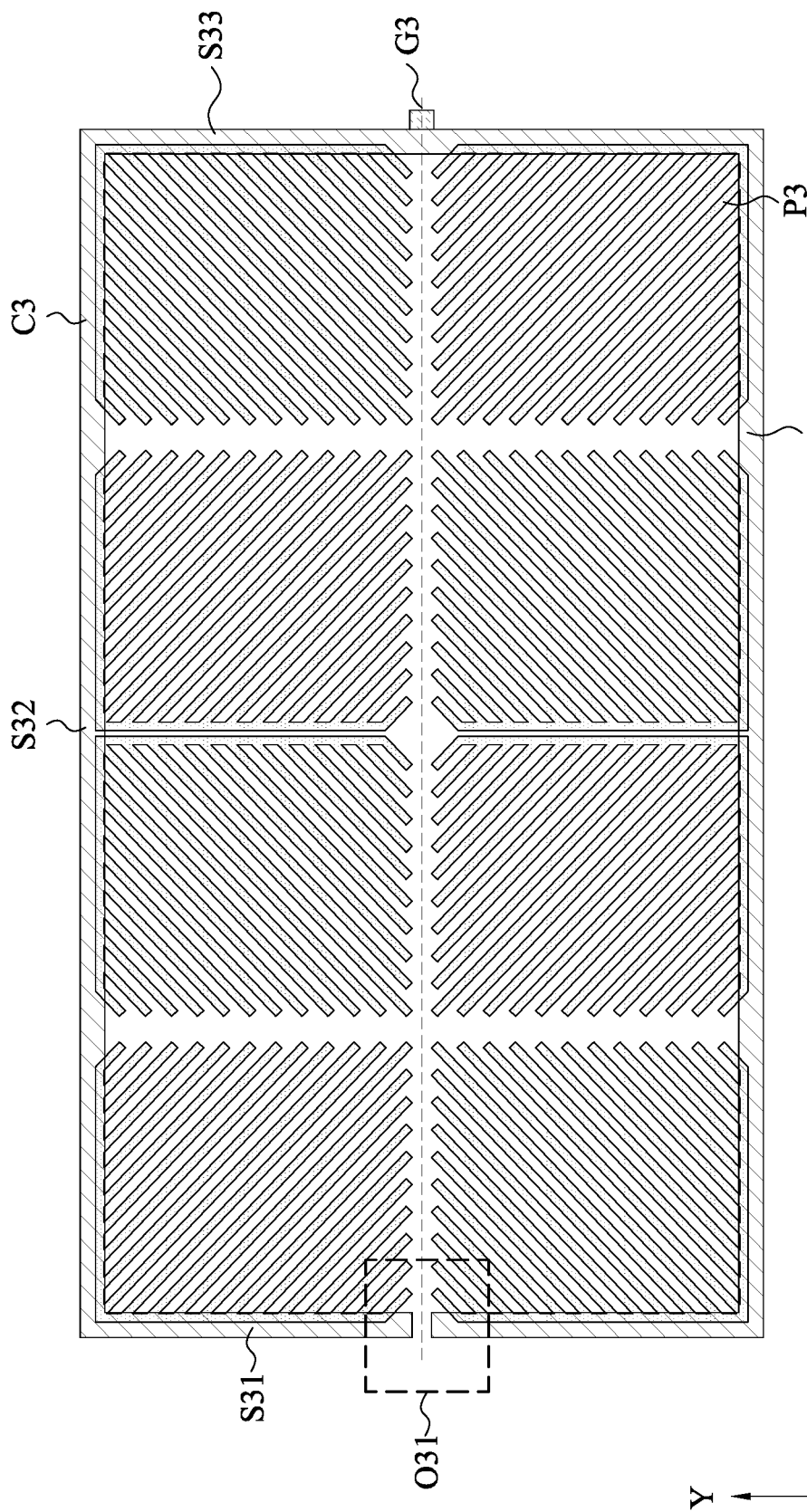
FIG. 3 is a schematic diagram of a shielding structure according to some embodiments of the present disclosure.

Reference is made to FIG. 3. FIG. 3 is a schematic diagram of a shielding structure 300 according to some embodiments of the present disclosure. The shielding structure 300 includes the patterned shielding layer P3 and the ring structure C3. The patterned shielding layer P3 extends along the XY plane and is located between the substrate 120 and the inductor structure 140 as shown in FIG. 1. The ring structure C3 couples to and stacks on the patterned shielding layer P3 along the Z direction. The Z direction is perpendicular to the XY plane. As illustrated in FIG. 3, the ring structure C3 surrounds the patterned shielding layer P3 and is configured to strengthen the shielding effect, the ring structure C3 includes an opening O31 and a ground terminal G3.

In detail, as illustrated in FIG. 3. The patterned shielding layer P3 includes the side S31 and the side S33 extending along the Y direction and the side S32 and the side S34 extending along the X direction, and the patterned shielding layer P3 is located in the area composed by the side S31, the side S32, the side S33 and the side S34. The ring structure C3 is disposed along the side S31, the side S32, the side S33 and the side S34. The ring structure C3 includes an opening O31 in the side S31.

Figure 4:
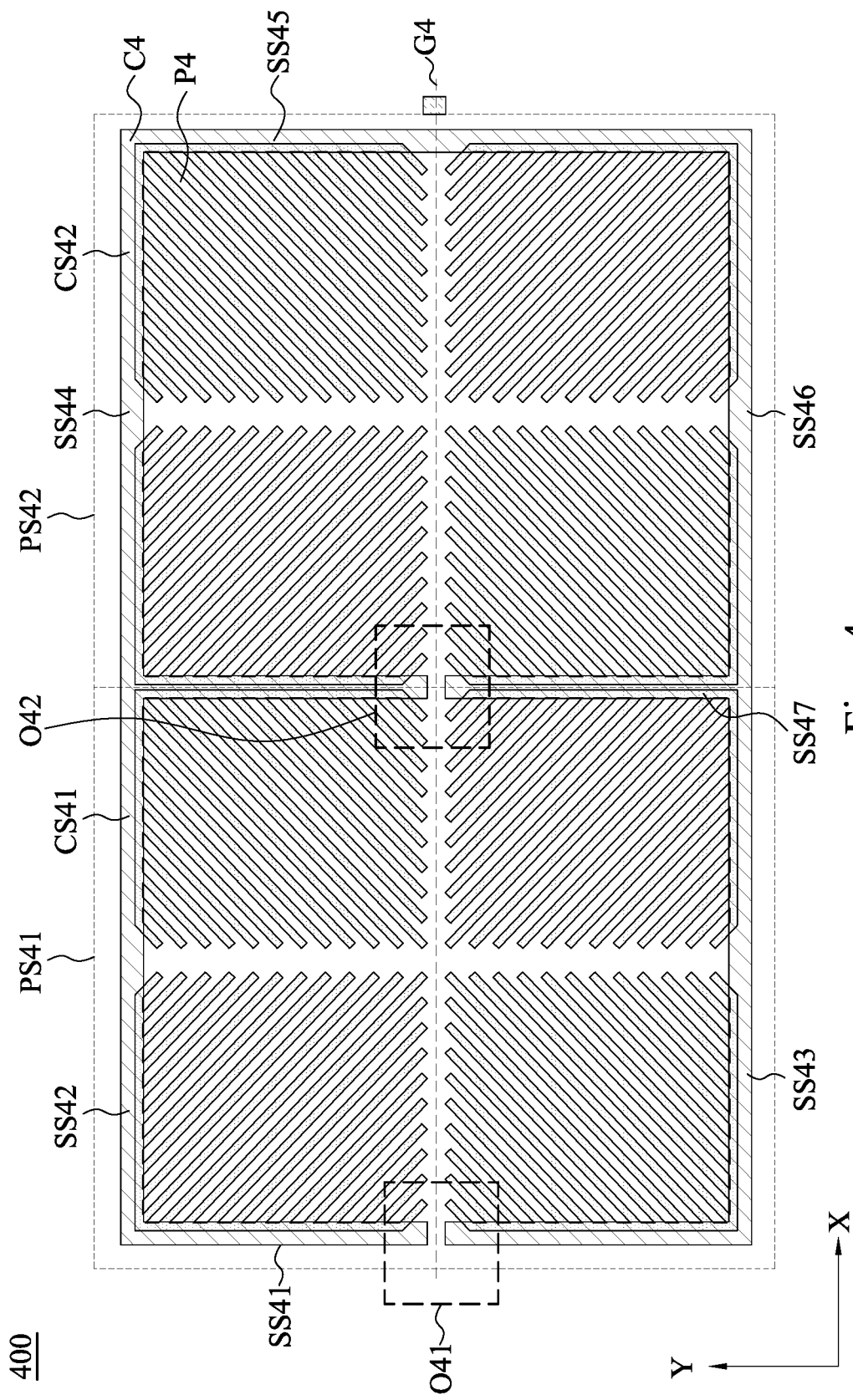
FIG. 4 is a schematic diagram of a shielding structure according to some embodiments of the present disclosure.

Reference is made to FIG. 4. FIG. 4 is a schematic diagram of a shielding structure 400 according to some embodiments of the present disclosure. The shielding structure 400 includes the patterned shielding layer P4 and the ring structure C4.

As illustrated in FIG. 4, the patterned shielding structure 400 includes the sub patterned shielding layers PS41 and PS42. The ring structure C4 is disposed surrounding the sub patterned shielding layers PS41 and PS42.

The sub patterned shielding layer PS41 includes the sub sides SS41, SS42 and SS43. The sub patterned shielding layer PS42 includes the sub sides SS44, SS45 and SS46. The ring structure C4 is disposed along the sub sides SS41, SS42, SS43, SS44, SS45 and SS46. Furthermore, as illustrated in FIG. 4, the sub side SS47 is included between the sub patterned shielding layers PS41 and PS42. The ring structure C4 is disposed along the sub side SS47. The sub sides SS41, SS47 and SS45 are extended along the Y direction, the sub sides SS42, SS43, SS44 and SS46 are extended along the X direction. The ring structure C4 includes the opening O41 at the sub side SS41 and the opening O42 at the sub side SS47.

The ring structure C4 forms the sub ring structure CS41 in the sub sides SS41, SS42, SS43 and SS47, and the ring structure C4 forms the sub ring structure CS42 in the sub sides SS44, SS45, SS46 and SS47.

As illustrated in FIG. 4, the ring structure C4 includes the ground terminal G4, so that the ring structure C4 and the patterned shielding layer P4 are grounded through the ground terminal G4.

Figure 5:
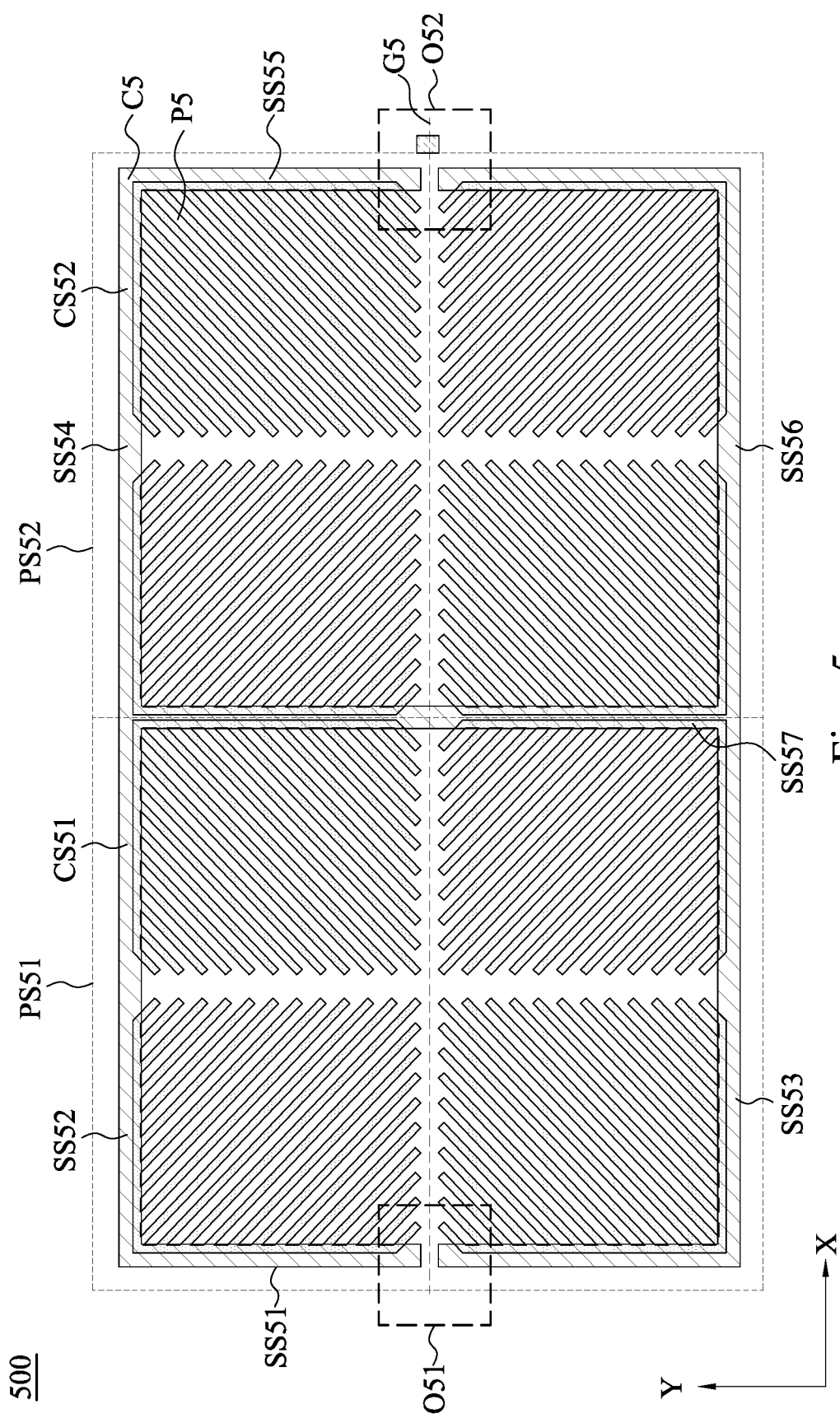
FIG. 5 is a schematic diagram of a shielding structure according to some embodiments of the present disclosure.

Reference is made to FIG. 5. FIG. 5 is a schematic diagram of a shielding structure 500 according to some embodiments of the present disclosure. The shielding structure 500 includes the patterned shielding layer P5 and the ring structure C5.

As illustrated in FIG. 5, the patterned shielding layer 500 includes the sub patterned shielding layers PS51 and PS52. The ring structure C5 is disposed surrounding the sub patterned shielding layers PS51 and PS52.

The sub patterned shielding layer PS51 includes the sub sides SS51, SS52 and SS53. The sub patterned shielding layer PS52 includes the sub side SS54, SS55 and SS56. The ring structure C5 is disposed along the sub sides SS51, SS52, SS53, SS54, SS55 and SS56. Furthermore, as illustrated in FIG. 5, the sub side SS57 is included between the sub patterned shielding layers PS51 and PS52. The ring structure C5 is disposed along the sub side SS57. The sub sides SS51, SS57 and SS55 are extended along the Y direction, the sub sides SS52, SS53, SS54 and SS56 are extended along the X direction. The ring structure C5 includes the opening O51 in the sub side SS51, and the ring structure C5 includes the opening O52 in the sub side SS55.

The ring structure C5 forms the sub ring structure CS51 in the sub side SS51, SS52, SS53 and SS57, and the ring structure C5 forms the sub ring structure CS52 in the sub side SS54, SS55, SS56 and SS57.

As illustrated in FIG. 5, the ring structure C5 includes the ground terminal G5, so that the ring structure C5 and the patterned shielding layer P5 are grounded through the ground terminal G5.

Figure 6:
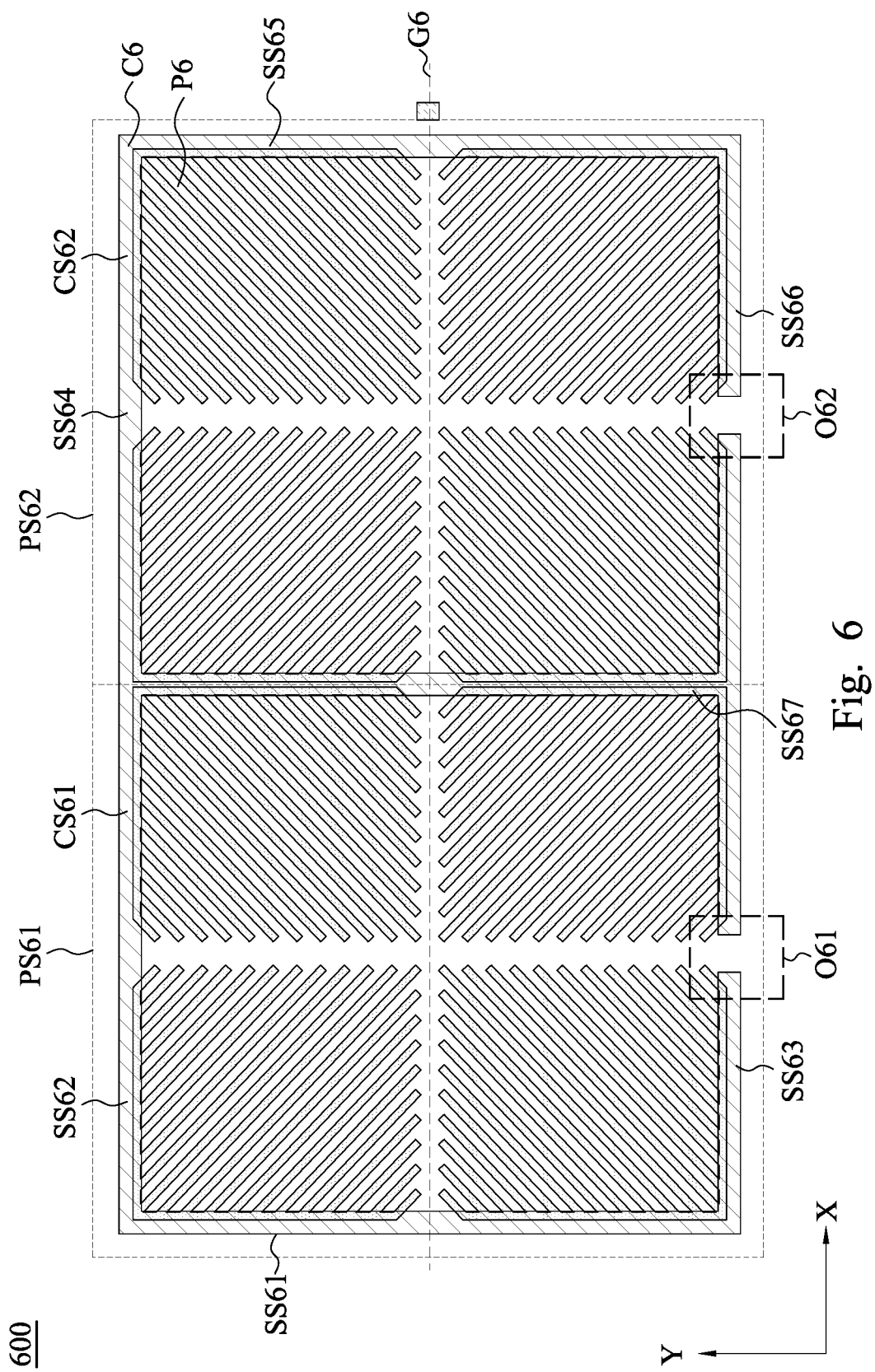
FIG. 6 is a schematic diagram of a shielding structure according to some embodiments of the present disclosure.

Reference is made to FIG. 6. FIG. 6 is a schematic diagram of a shielding structure 600 according to some embodiments of the present disclosure. The shielding structure 600 includes the patterned shielding layer P6 and the ring structure C6.

As illustrated in FIG. 6, the patterned shielding structure 600 includes the sub patterned shielding layers PS61 and PS62. The ring structure C6 is disposed surrounding the sub patterned shielding layers PS61 and PS62.

The sub patterned shielding layer PS61 includes the sub sides SS61, SS62 and SS63. The sub patterned shielding layer PS62 includes the sub sides SS64, SS65 and SS66. The ring structure C6 is disposed along the sub sides SS61, SS62, SS63, SS64, SS65 and SS56. Furthermore, as illustrated in FIG. 6, the sub side SS67 is included between the sub patterned shielding layers PS61 and PS62. The ring structure C6 is disposed along the sub side SS67. The sub sides SS61, SS67 and SS65 are extended along the Y direction, and the sub sides SS62, SS63, SS64 and SS66 are extended along the X direction. The ring structure C6 includes the opening O61 at the sub side SS63, and the ring structure C6 includes the opening O62 at the sub side SS66.

The ring structure C6 forms the sub ring structure CS61 in the sub sides SS61, SS62, SS63 and SS67, and the ring structure C6 forms the sub ring structure CS62 in the sub sides SS64, SS65, SS66 and SS67.

As illustrated in FIG. 6, the ring structure C6 includes the ground terminal G6, so that the ring structure C6 and the patterned shielding layer P6 are grounded through the ground terminal G6.

Reference is made to FIG. 2 again. In FIG. 2, the ring structure 180 includes the openings O21 and O22. The inductor structure 140 includes the opening O140. The openings O21 and O22 of the ring structure 180 and the opening O140 of the inductor structure 140 overlap in the X direction. Furthermore, the ground terminal G2 of the ring structure 180 and the openings O21 and O22 of the ring structure 180 overlap in the X direction.

Furthermore, the inductor 140 as illustrated in FIG. 2 includes the connection part CP2, and the connection part CP2 staggers at the opening O22 of the ring structure 180.

It may be known from FIG. 2 that the inductor structure 140 is located at the inner side surrounded by the ring structure 180. Furthermore, the patterned shielding layer 160 is disposed in the area SI surrounded by the ring structure 180.

Figure 7:
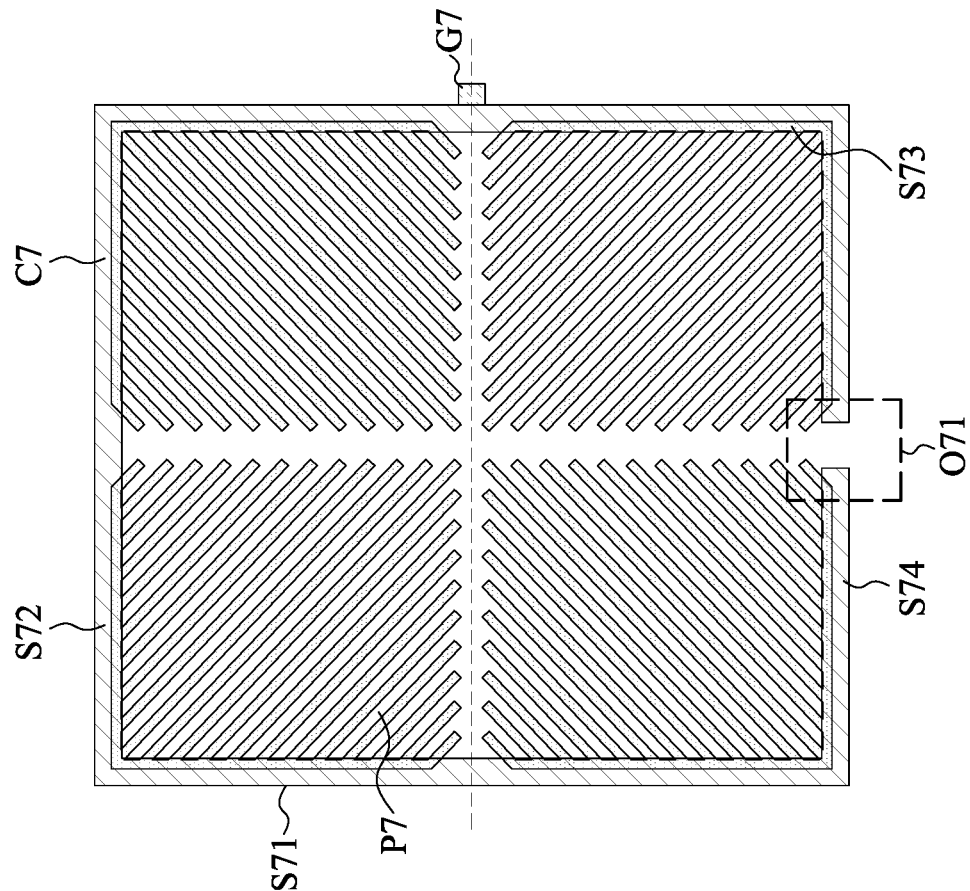
FIG. 7 is a schematic diagram of a shielding structure according to some embodiments of the present disclosure.

Reference is made to FIG. 7. FIG. 7 is a schematic diagram of a shielding structure 700 according to some embodiments of the present disclosure. The shielding structure 700 includes the patterned shielding layer P7 and the ring structure C7. The patterned shielding layer P7 is extended along the XY plane and is located between the substrate 120 and the inductor structure 140 as illustrated in FIG. 1. The ring structure C3 is coupled to and stacked on the patterned shielding layer P7 along the Z direction, and the Z direction is perpendicular to the XY plane. As illustrated in FIG. 3, the ring structure C7 surrounds the patterned shielding layer P7, so as to strengthen the shielding effect, and the ring structure C7 includes the opening O71 and the ground terminal G7.

In detail, as illustrated in FIG. 7. The patterned shielding layer P7 includes the side S71 and the side S73 extending along the Y direction, and the patterned shielding layer P7 includes the side S72 and the side S74 extending along the X direction, and the patterned shielding layer P7 is located in the area composed by the side S71, the side S72, the side S73 and the side S74. The ring structure C7 is disposed along the side S71, the side S72, the side S73 and the side S74. The ring structure C7 includes the opening O71 in the side S74.

It should be noted that, the direction of the patterned shielding layers P3 to P7 drawn in FIG. 3 to FIG. 7 is a direction of 45 degrees between the X direction and the Y direction, however, in the embodiments of the present disclosure, the direction of the patterned shielding layer are not limited thereto. The patterned shielding layer can be at any angle. The more commonly used angles are parallel to the X direction, parallel to the Y direction, or a direction sandwiched by 45 degrees between the X direction and the Y direction.

Figure 8:
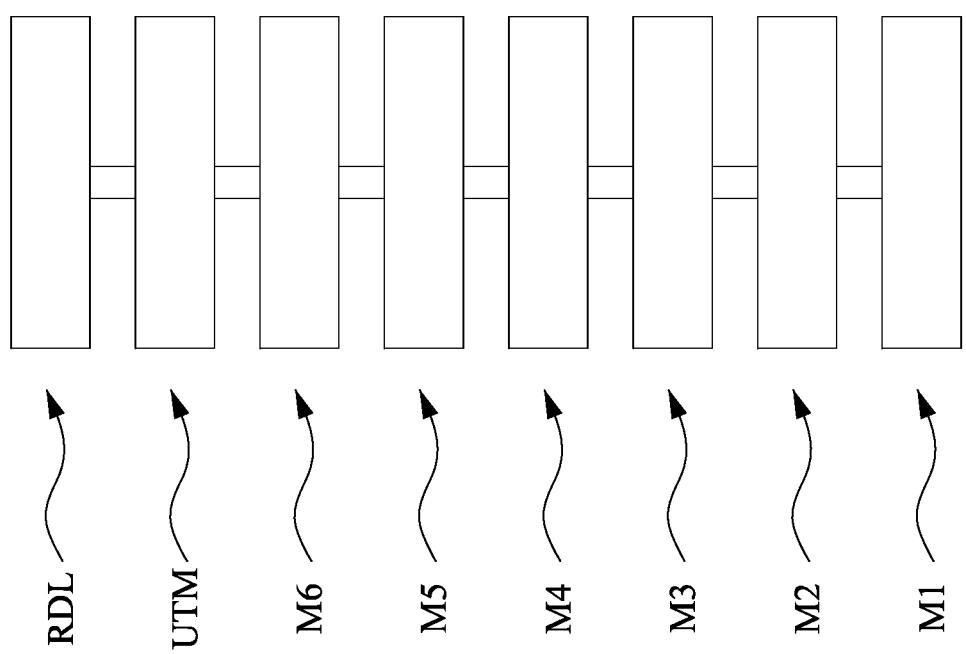
FIG. 8 is a section view diagram of a shielding structure according to some embodiments of the present disclosure.

Reference is made to FIG. 8. FIG. 8 is a section view diagram of a shielding structure 800 according to some embodiments of the present disclosure. The shielding structure shown in FIG. 8 corresponds to the cross-sectional view of FIG. 2. As illustrated in FIG. 8, the shielding structure includes several metal structures. In some embodiments, the patterned shielding layer 160 as illustrated in FIG. 2 is disposed at the metal layer M1. The ring structure 180 is disposed at the metal layers M1, M2, M3, M4, M5, and M6, and the ring structure 180 of each layer can include different shapes. For example, in some embodiments, the ring structure 180 of the metal layer M1 can be the ring structure C3 in FIG. 3, and the ring structure 180 of the metal layer M2 can be the ring structure C4 in FIG. 4, etc. Furthermore, in some embodiments, the ring structure 180 is disposed at the metal layers M1, M2, M3, M4, M5, M6, and UTM. In some other embodiments, the ring structure 180 is disposed at the metal layers M1, M2, M3, M4, M5, M6, UTM, and RDL.

Through the combination of the patterned shielding layer and the ring structure, a better shielding effect can be achieved. In this way, the quality factor value (Q value) of the inductor structure is maintained or even improved. Furthermore, by grounding the ring structure and the patterned shielding layer through the ground terminal of the ring structure, the structure can be grounded at the metal layer RDL or UTM, which is faster than grounding through the patterned shielding layer at M1.

In this document, the term "coupled" may also be termed as "electrically coupled", and the term "connected" may be termed as "electrically connected". "coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed, and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A shielding structure, comprising:
    a patterned shielding layer, extended along a plane and located between an inductor structure and a substrate; and
    a ring structure, coupled to and stacked on the patterned shielding layer along a first direction, wherein the first direction is perpendicular to the plane, wherein the ring structure surrounds the patterned shielding layer, wherein the ring structure comprises at least one opening and a ground terminal, wherein the ring structure partially overlaps the patterned shielding layer in the first direction.

2. The shielding structure of claim 1, wherein the patterned shielding layer includes a first side, a second side, a third side and a fourth side, and the ring structure is disposed along the first side, the second side, the third side and the fourth side.

3. The shielding structure of claim 2, wherein the patterned shielding layer comprises a first opening of the at least one opening in the first side.

4. The shielding structure of claim 1, wherein the patterned shielding layer comprises a first sub patterned shielding layer and a second sub patterned shielding layer, wherein the ring structure surrounds the first sub patterned shielding layer and the second sub patterned shielding layer.

5. The shielding structure of claim 4, wherein the first sub patterned shielding layer comprises a first sub side, a second sub side and a third sub side, and the second sub patterned shielding layer comprises a fourth sub side, a fifth sub side and a sixth sub side, wherein the ring structure is further configured to be disposed along the first sub side, the second sub side, the third sub side, the fourth sub side, the fifth sub side and the sixth sub side.

6. The shielding structure of claim 5, wherein the ring structure comprises a first opening of the at least one opening in the first sub side.

7. The shielding structure of claim 5, wherein a seventh sub side is comprised between the first sub patterned shielding layer and the second sub patterned shielding layer, and the ring structure is disposed along the seventh sub side.

8. The shielding structure of claim 7, wherein the ring structure comprises a first opening of the at least one opening in the first sub side, and the ring structure comprises a second opening of the at least one opening in the seventh sub side.

9. The shielding structure of claim 8, wherein the first sub side and the seventh sub side are located in a second direction.

10. The shielding structure of claim 7, wherein the ring structure comprises a first opening of the at least one opening in the first sub side, and the ring structure comprises a second opening of the at least one opening in the fourth sub side.

11. The shielding structure of claim 10, wherein the first sub side and the fourth sub side are located in a second direction.

12. The shielding structure of claim 11, wherein the seventh sub side is located in the second direction.

13. The shielding structure of claim 11, wherein the seventh sub side is located in a third direction.

14. The shielding structure of claim 7, wherein the ring structure forms a first sub ring structure in the first sub side, the second sub side, the third sub side and the seventh sub side, and forms a second sub ring structure in the fourth sub side, the fifth sub side, the sixth sub side and the seventh sub side.

15. An inductor device, comprising:
an inductor structure;
a patterned shielding layer, extended along a plane and located between the inductor structure and a substrate; and
a ring structure, coupled to and stacked on the patterned shielding layer along a first direction, wherein the first direction is perpendicular to the plane, wherein the ring structure surrounds the patterned shielding layer, wherein the ring structure comprises a first opening and a ground terminal, wherein the ring structure partially overlaps the patterned shielding layer in the first direction.

16. The inductor device of claim 15, wherein the first opening of the ring structure and a second opening of the inductor structure overlap in a second direction.

17. The inductor device of claim 15, wherein the ring structure comprises a second opening, wherein the inductor structure comprises a connection part, and the connection part comprises an intersection part at the second opening of the ring structure.

18. The inductor device of claim 15, wherein the inductor structure is located at an inner side of the ring structure.

19. The inductor device of claim 15, wherein the ring structure comprises an area, and the patterned shielding layer is disposed in the area.

20. The inductor device of claim 15, wherein the ground terminal and the first opening overlap in a second direction.

* * * * *